United States Patent
Murphy et al.

(10) Patent No.: US 11,971,454 B2
(45) Date of Patent: Apr. 30, 2024

(54) SYSTEM AND METHOD FOR DETERMINING A BATTERY CONDITION

(71) Applicant: Zitara Technologies, Inc., San Francisco, CA (US)

(72) Inventors: Evan Murphy, San Francisco, CA (US); Patrick Herring, San Francisco, CA (US); Daniel Vickery, San Francisco, CA (US); Elizabeth Goldberg, San Francisco, CA (US); Jacqueline Maslyn, San Francisco, CA (US); Matthew Bohan, San Francisco, CA (US); Shyam Srinivasan, San Francisco, CA (US); Dustin Summy, San Francisco, CA (US); Zachary Gima, San Francisco, CA (US); Brian Goodall, San Francisco, CA (US); Mark Tobenkin, San Francisco, CA (US)

(73) Assignee: Zitara Technologies, Inc., San Francisco, CA (US)

( * ) Notice: Subject to any disclaimer, the term of this patent is extended or adjusted under 35 U.S.C. 154(b) by 0 days.

(21) Appl. No.: 18/078,814

(22) Filed: Dec. 9, 2022

(65) Prior Publication Data

US 2023/0184839 A1 Jun. 15, 2023

Related U.S. Application Data

(60) Provisional application No. 63/287,819, filed on Dec. 9, 2021, provisional application No. 63/388,141, filed on Jul. 11, 2022.

(51) Int. Cl.
*G06F 11/30* (2006.01)
*G01R 31/367* (2019.01)
(Continued)

(52) U.S. Cl.
CPC ......... *G01R 31/367* (2019.01); *G01R 31/385* (2019.01); *G01R 31/396* (2019.01)

(58) Field of Classification Search
CPC .................................................. G01R 31/367
See application file for complete search history.

(56) References Cited

U.S. PATENT DOCUMENTS 6,656,234 B2 12/2003 Dexter et al.
7,554,294 B2 6/2009 Srinivasan et al.
(Continued)

FOREIGN PATENT DOCUMENTS

CN 111438077 A 7/2020
DE 102019111956 A1 11/2020
(Continued)

OTHER PUBLICATIONS

"Meta-Model Mechanism", https://www.cs.wmich.edu/~ooda/metamodel.html.
(Continued)

*Primary Examiner* — Phuong Huynh
(74) *Attorney, Agent, or Firm* — Jeffrey Schox; Randy Mehlenbacher

(57) ABSTRACT

A system and method for determining whether a battery is operating in an anomalous condition can include or be configured to measure sensor data, estimate a local property of the battery using on the sensor data, and classify whether the battery is operating in the anomalous condition based on the local property.

19 Claims, 7 Drawing Sheets

(51) Int. Cl.
*G01R 31/385* (2019.01)
*G01R 31/396* (2019.01)

(56) References Cited

U.S. PATENT DOCUMENTS

| | | | |
|---|---|---|---|
| 7,847,558 | B2 | 12/2010 | Runkle et al. |
| 7,894,512 | B2 | 2/2011 | Beadle et al. |
| 8,723,527 | B2 | 5/2014 | Kudo et al. |
| 8,961,004 | B2 | 2/2015 | Srinivasan et al. |
| 9,593,952 | B2 | 3/2017 | Goodall et al. |
| 9,726,730 | B2 | 8/2017 | Gross |
| 9,989,595 | B1 | 6/2018 | Wang et al. |
| 10,153,521 | B2 | 12/2018 | Beaston |
| 10,295,606 | B2 | 5/2019 | McCoy |
| 10,310,022 | B2 | 6/2019 | Park et al. |
| 10,422,834 | B2 | 9/2019 | Tang |
| 10,446,879 | B2 | 10/2019 | Povey et al. |
| 10,656,209 | B2 | 5/2020 | Jeon |
| 10,818,981 | B2 | 10/2020 | Srinivasan et al. |
| 10,969,752 | B1 | 4/2021 | Brink |
| 11,097,633 | B1 | 8/2021 | Kohn et al. |
| 11,181,587 | B1 * | 11/2021 | Srinivasan .......... H01M 10/486 |
| 2004/0024559 | A1 | 2/2004 | Down et al. |
| 2012/0098481 | A1 | 4/2012 | Hunter et al. |
| 2012/0175953 | A1 | 7/2012 | Ohkawa et al. |
| 2013/0069660 | A1 | 3/2013 | Bernard et al. |
| 2014/0218040 | A1 | 8/2014 | Kim |
| 2014/0244225 | A1 | 8/2014 | Balasingam et al. |
| 2015/0268309 | A1 | 9/2015 | Kim |
| 2015/0280294 | A1 | 10/2015 | Shin et al. |
| 2015/0304772 | A1 | 10/2015 | Risberg et al. |
| 2015/0369875 | A1 | 12/2015 | Ishii |
| 2017/0003352 | A1 | 1/2017 | Barre et al. |
| 2017/0199247 | A1 | 7/2017 | Joe |
| 2017/0288414 | A1 | 10/2017 | Klein et al. |
| 2018/0083461 | A1 | 3/2018 | Ravi et al. |
| 2018/0095140 | A1 | 4/2018 | Park et al. |
| 2018/0095141 | A1 | 4/2018 | Wild et al. |
| 2018/0111599 | A1 | 4/2018 | Wang et al. |
| 2018/0292465 | A1 | 10/2018 | Osara et al. |
| 2018/0337536 | A1 | 11/2018 | Li et al. |
| 2019/0120908 | A1 * | 4/2019 | Naha .................. G01R 31/3648 |
| 2019/0168617 | A1 | 6/2019 | Ling et al. |
| 2019/0235027 | A1 | 8/2019 | Sugiura et al. |
| 2020/0070682 | A1 | 3/2020 | Hellgren |
| 2020/0355749 | A1 | 11/2020 | Takahashi et al. |
| 2020/0376968 | A1 | 12/2020 | Wang et al. |
| 2021/0055348 | A1 | 2/2021 | Kim et al. |
| 2021/0280920 | A1 | 9/2021 | Rinaldo et al. |
| 2021/0349155 | A1 | 11/2021 | Srinivasan et al. |

FOREIGN PATENT DOCUMENTS

| | | |
|---|---|---|
| DE | 102019111958 A1 | 11/2020 |
| DE | 102019111976 A1 | 11/2020 |
| DE | 102019111979 A1 | 11/2020 |
| DE | 102019121461 B3 | 12/2020 |
| WO | 2020036775 A1 | 2/2020 |

OTHER PUBLICATIONS

Gima, Zachary, et al., "Optimal Sensor Selection for an Electrochemical Li-Ion Battery Model", 2020 ECS—The Electrochemical Society, vol. MA2020-01, A04: Student Battery Slam 4.

Merkle, Lukas, et al., "Architecture of a Digital Twin for Enabling Digital Services for Battery Systems", 2019 IEEE International Conference on Industrial Cyber Physical Systems (ICPS), Taipei, Taiwan, May 6-9, 2019.

Severson, Kristen A., "Data-driven prediction of battery cycle life before capacity degradation", Nature Energy, 4, pp. 383-391 (2019), Mar. 25, 2019.

* cited by examiner

SYSTEM AND METHOD FOR DETERMINING A BATTERY CONDITION

CROSS-REFERENCE TO RELATED APPLICATIONS

This application claims the benefit of U.S. Provisional Application No. 63/388,141, filed 11 Jul. 2022 and U.S. Provisional Application No. 63/287,819, filed 9 Dec. 2021, each of which is incorporated in its entirety by this reference.

TECHNICAL FIELD

This invention relates generally to the battery analysis field, and more specifically to a new and useful system and method in the battery analysis field.

BACKGROUND

Typically, a battery condition (e.g., whether the battery is operating normally or anomalously) is determined over several charge and discharge cycles (e.g., to accurately determine a state such as a state of health, anomaly state, etc. of the battery). However, this can lead to operating the battery in potentially dangerous conditions (e.g., outside of specified operation parameters).

Thus, there is a need in the battery analysis field to create a new and useful battery analysis system and method. This invention provides such new and useful battery analysis system and method.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1:
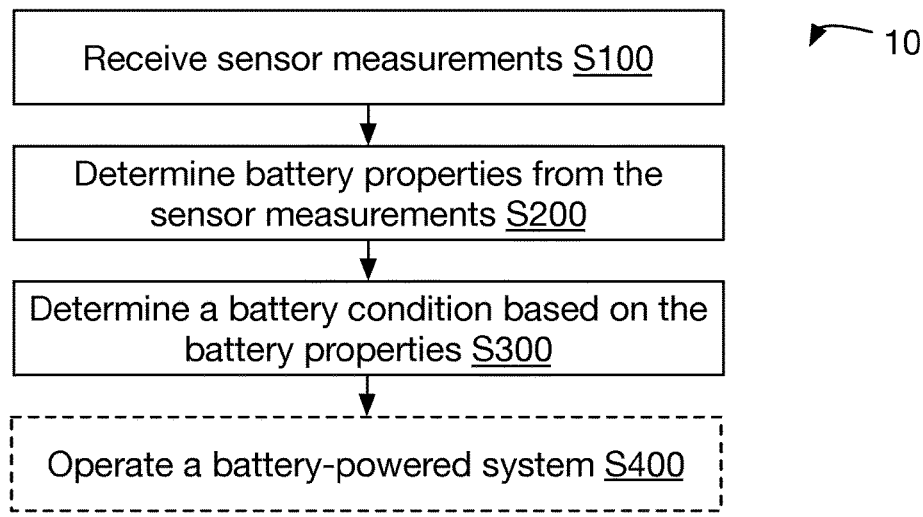
FIG. 1 is a schematic representation of the method.

As shown in FIG. 1, the method 10 can include receiving sensor measurements S100, determining battery properties from the sensor measurements S200, and determining a battery condition based on the battery properties S300. The method can optionally include operating a battery-powered system S400 and/or any suitable steps.

The method 10 can function to monitor a battery condition of a battery-operated system such as to detect anomalies or unexpected battery status (e.g., one or more disconnected cells, shorting within the battery, anomalous thermal behavior, thermal disconnection, etc.). Exemplary battery-operated systems 20 included: unmanned aerial vehicles (e.g., UAVs, drones, etc.), satellites, rovers, electric vehicles (e.g., electric cars, electric trucks, shipping vehicles, buses, trains, electric passenger vehicles, etc.), electric submarines, electric boats, user devices (e.g., smart phones, computers, power tools, yard tools, toys, etc.), electrical generators, consumer electronics, electric bicycles, scooters (e.g., electric scooters, electric motorbikes, etc.), mobility scooters, wheelchairs, personal transporters (e.g., kick scooters, electric skateboards, self-balancing unicycles, Segway, etc.), electric airplanes, construction equipment, and/or any suitable external system. However, the method can perform any function.

2. Benefits.

Variations of the technology can confer several benefits and/or advantages.

First, variants of the technology can be beneficial for helping avoid dangerous operation of a battery system. For example, the method can be used to detect a battery cell disconnection, a thermal disconnection, a thermal anomaly (e.g, unexpected heat source, unexpected heat sink, etc.), and/or an electrical short. By detecting the anomalous behavior, a safer operation condition (e.g., charging or discharging rate) can be suggested and/or used (e.g., a lower charging or discharging rate can be set when a cell is disconnected to avoid over charging the remaining connected battery cells).

Second, variants of the technology can enable anomalous conditions to be detected during normal operation of the battery-operated system. For example, rather than requiring multiple charging and discharging cycles to identify a battery cell disconnection (or other anomalous operation condition), the technology can make measurements and process the measurements during a single battery cycle (e.g., charge or discharge). Detecting potential anomalies within a single cycle can be advantageous for avoiding operating the battery in hazardous conditions.

Third, variants of the technology can enable detection of potential battery anomaly conditions in low compute environments. For instance, the technology can leverage efficient algorithms and/or computations that can work using 16 bit fixed point arithmetic (and/or arithmetic with greater memory and/or complexity such as 32 bit, floating point arithmetic, etc.). Even in variants that are not compute constrained (e.g., when the method operates in a non-low compute environment, variants of the method that continually update states of a state estimator, etc.), the technology can be beneficial for detecting battery conditions with noisy sensors and/or unpredictable state updates, for identifying potential states of interest or relevance to the battery condition, and/or can otherwise be beneficial.

However, variants of the technology can confer any other suitable benefits and/or advantages.

As used herein, "substantially" or other words of approximation (e.g., "about," "approximately," etc.) can be within a predetermined error threshold or tolerance of a metric, component, or other reference (e.g., within 0.001%, 0.01%, 0.1%, 1%, 5%, 10%, 20%, 30%, etc. of a reference), or be otherwise interpreted.

3. System

Figure 6:
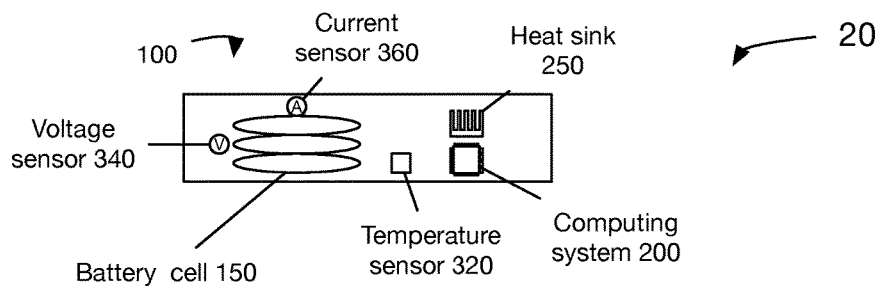
FIG. 6 is a schematic representation of an exemplary system and sensor arrangements.

As shown for example in FIG. 6, the system 20 can include a computing system 200 (e.g., processor), which can include a modeler 230, a classifier 260, a state estimator 290, and/or any suitable component(s). The system can optionally include a battery 100, one or more sensors 300, an input source (e.g., a user interface such as a touchscreen, stylus, buttons, haptics, auditory, user input, etc. at an operator device, the external system, a user device, etc.), one or more thermal elements (e.g., heat sources, heat sinks 250, etc. where in some variants, the computing system can operate as a heat source), and/or any suitable components. The system preferably functions to detect anomalous battery behavior (e.g., determine whether a battery is operating in an anomalous condition, determine a confidence that the battery is operating in an anomalous condition, etc.). However, the system can additionally or alternatively function in any manner.

The battery(s) 200 function to provide power to the computing system, the external system, and/or a component thereof (e.g., a motor, a camera, load, etc.), and/or can otherwise provide power to any suitable components or systems. The battery(s) are preferably secondary cells (e.g., rechargeable battery), but can be primary cells (e.g., not rechargeable battery), and/or any suitable battery, capacitor, and/or supercapacitor. The battery is preferably mounted to (e.g., integrated in) the external system, but can be remote from the external system (e.g., provide energy to the external system wirelessly), and/or can otherwise be arranged.

Each battery can include one or more: battery cells (e.g., a container to store chemical energy such as a prismatic battery cell, pouch battery cell, cylindrical battery cell, etc.; including an anode, cathode, separator, electrolyte, etc.), battery modules (e.g., groups or clusters of battery cells), battery packs (e.g., an enclosure that includes one or more battery cells or battery modules, processors configured to run software, heating and/or cooling systems, etc. that delivers power to the components of the external system), and/or any suitable components.

Each battery can be described by a set of battery properties. The battery properties can be cell-specific properties, module-specific properties, pack-specific properties, generic properties, and/or any suitable properties. The properties can be static (e.g., fixed such as determined at the time of installation or manufacture) and/or variable (e.g., change during operation of the battery, change over time as the battery ages, change depending on the number of battery operation cycles, etc.). Battery properties can be: directly measured; calculated, derived, inferred, or estimated (e.g., from directly measured battery properties, from simulations, from charging or discharging the battery, etc.); received (e.g., from a manufacturer, from an operator, from a data sheet, etc.), and/or otherwise be accessed. Battery properties can include internal battery properties and/or external battery properties (e.g., properties associated with an environment that the battery is in).

Exemplary battery properties include: voltage (e.g., open circuit voltage, instantaneous voltage, end-of-life voltage, beginning of life voltage, voltage limits, etc.), current (e.g., short circuit current, instantaneous current, end-of-life current, beginning-of-life current, current limits, taper currents, etc.), temperature (e.g., internal temperature; surface temperature; environment temperature; set temperature; local temperature such as an average temperature of a battery cell, temperature within a predetermined area or volume of the battery, etc.; average temperature, etc.), temperature gradient (e.g., within an external system, across a battery cell, across a battery module, across a battery pack, etc.), humidity, pressure (e.g., environmental pressure, mechanical pressure, air pressure, etc.), resistance (e.g., internal resistance, ohmic resistance, capacitive resistance, inductive resistance, instantaneous resistance, etc.), impedance, capacity (e.g., specific capacity), capacitance (e.g., effective capacitance), inductance, component thickness (e.g., anode thickness, cathode thickness, separator thickness, solid-electrolyte interface layer thickness, etc.), particle radius (e.g., anode particle radius, cathode particle radius, etc.), transference number, Brugman number, solution diffusivity, solution volume fraction (e.g., anode, cathode, separator, etc. solution volume fraction), diffusivity (e.g., anode solid diffusivity, cathode solid diffusivity, etc.), reaction rate (e.g., anode reaction rate, cathode reaction rate, etc.), materials (e.g., cathode material, anode material, electrolyte material, separator, etc.), geometry, size, solution conductivity, entropic heating coefficient, thermal conductivity, electrical conductivity, thermal mass, C-rate (e.g., nominal C-rate, maximum C-rate, etc.), charge (e.g., maximum charge, charge current limit, discharge current limit, delivered charge, stored charge, etc.), state (SoX) of the battery (e.g., state of charge (SoC), state of health (SoH), state of power (SoP), state of safety (SoS), etc.), energy (e.g., energy delivered since last charge or discharge, total energy delivered for a given period of time, etc.), power, time (e.g., time since last charge or discharge, age, remaining lifetime, etc.), battery age (e.g., time since battery manufacture, total number of charging and/or discharging cycles, amount of time the battery has been at a target or threshold charge, etc.), ion concentration (e.g., lithium ion concentration), and/or any suitable properties.

The optional sensor(s) 300 function to measure one or more battery properties, external system properties, environmental conditions (e.g., of an environment proximal to, surrounding, adjacent to, near, etc.) of the battery or external system, and/or any suitable properties. The sensors can be connected to (e.g., in contact with) the battery(s), collocated with (e.g., mounted to) the external system, remote from the external system (e.g., a wireless sensor), within a threshold distance of the battery and/or components thereof, and/or otherwise be configured. In variants, each cell of a battery can include a sensor, each module of a battery can include a sensor, each battery pack can include a sensor, a subset of cells can include a sensor, a subset of modules can include a sensor, a subset of packs can include a sensor, and/or the sensor can otherwise be associated with any suitable battery(s) and/or load (e.g., a motor, radio, camera, light, resistor, capacitor, etc. such as of an external device).

Exemplary sensors include: battery management systems (BMS) monitors, thermometers 320, pressure gauges, external system sensors (e.g., odometers, altimeters, power sensors, inertial measurement unit sensors, accelerometers, gyroscopes, etc.), anemometer, weather sensors (e.g., illumination sensors, humidity sensors, road condition sensors, etc.), clocks, electrochemical impedance spectroscopy (EIS) sensors, voltmeters 340, ammeters 360, ohmmeters, multimeters, and/or any suitable sensors (e.g., any sensor whose reading is directly or indirectly affected by the battery state).

Figure 8:
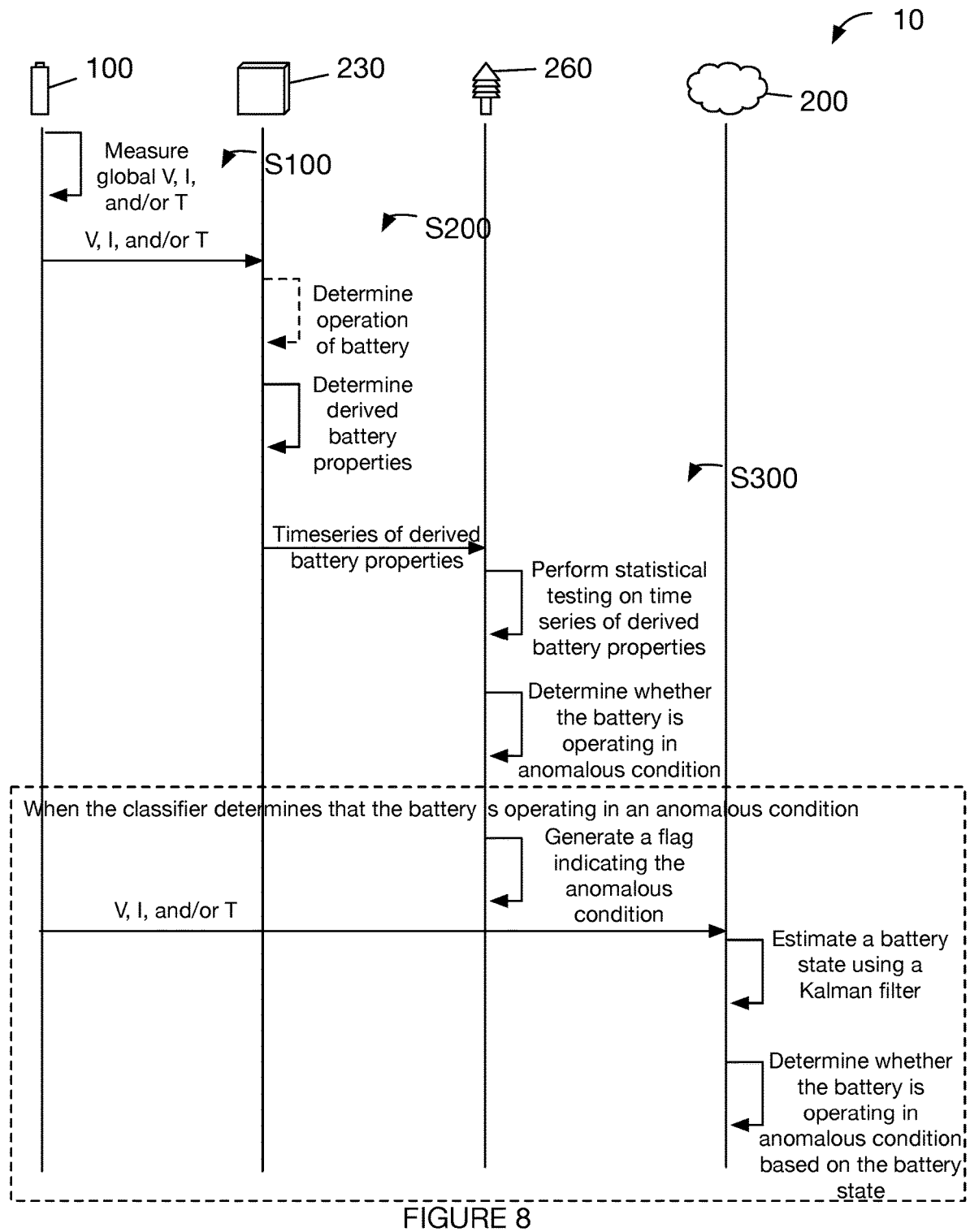
FIG. 8 is a schematic flow diagram of an example of data transfer between endpoints.

The computing system 100 preferably functions to determine whether (e.g., with a threshold confidence, with at most a threshold false negative rate, with at most a threshold false positive rate, etc.) a battery is operating in and/or has experienced an anomalous condition. However, the computing system can additionally or alternatively function to monitor (and/or determine) a state of the battery and/or can otherwise function. The computing system can be local (e.g., to the system, to the external system, as shown for example in FIG. 6, etc.), remote (e.g., server, cloud computing system, etc.), and/or distributed (e.g., between an edge or local computing system and a remote computing system, between two or more local computing systems, between remote computing systems, as shown for example in FIG. 8, etc.). The computing system can include any suitable processors (e.g., CPU, GPU, TPU, etc.), microprocessors, memory, controllers, and/or other components.

The computing system 200 can include: a modeler 230, a classifier 260, a state estimator 290, and/or any suitable components.

The state estimator preferably functions to estimate a state (e.g., a current state, a future state, etc.) of the external system and/or battery. The state estimator can be on a local computing system, can be on a remote computing system (e.g., run on a cloud server), can be distributed (e.g., run on a local and remote computing system, include a first local state estimator and a second remote state estimator, etc.), and/or can otherwise be implemented.

Inputs to the state estimator can include: sensor data, filtered data, schedule(s) (e.g., selected mode(s) such as model(s), model noise covariance, hyperparameters, sensor noise covariance, active parameters, inactive parameters, active parameter covariances, etc.; schedules as disclosed in U.S. patent application Ser. No. 17/959,998 titled 'SYSTEM AND METHOD FOR BATTERY MANAGEMENT' filed 4 Oct. 2022, which is incorporated in its entirety by this reference; etc.), battery properties, external system properties, a load profile, and/or any suitable inputs.

Outputs (e.g., states) from the state estimator can include: states of the battery (e.g., predicted state of the battery during or after operating the battery), battery properties (e.g., true battery properties, denoised battery properties, etc.), states of the external system, parameters of the model (e.g., active parameters of the model), model error (e.g., estimates of an error in the model parameters), time (e.g., lifetime of the battery), and/or any suitable states. For example, outputs (e.g., states determined by) of the state estimator can include a state of charge, temperature, electrochemical state (e.g., cathode ion distribution), model parameters (such as charge capacity and/or other parameters that determine the battery's general performance capability), and/or any suitable outputs.

The state estimator can include: a Kalman filter, an extended Kalman filter, an unscented Kalman filter, an ensemble Kalman filter, a look-up table, a Markov Chain Monte Carlo technique, linearization techniques, machine learning techniques (e.g., a neural network), and/or any suitable particle filter, sequential Monte Carlo technique, or other state estimator. The state estimator (e.g., type, where the state estimator runs, etc.) can depend on an accuracy of the estimated state (e.g., a target accuracy, based on the application, etc.), an amount of processing power available, and/or otherwise depend on any suitable properties.

The state estimator often uses the same model as the modeler. However, the state estimator can use a more complex model (e.g., a more accurate model, a model that includes more terms, a more granular model, etc. such as because the state estimator generally estimates states less frequently that the modeler computes battery properties and therefore can afford a more accurate model) and/or a less complex model (e.g., to facilitate frequent state estimator computations).

In some examples, the state estimator can be a state estimator as disclosed in U.S. patent application Ser. No. 17/314,867, titled 'BATTERY ANALYSIS SYSTEM AND METHOD' filed 7 May 2021 which is incorporated in its entirety by this reference. However, any suitable state estimator can be used.

The modeler preferably functions to determine one or more battery property (e.g., derived battery property) based on the sensor data. The modeler is preferably implemented as part of a local computing system. However, additionally or alternatively the modeler can be implemented as part of a remote computing system (e.g., run on a cloud server), can be distributed (e.g., run on a local and remote computing system, include a first local modeler and a second remote modeler, etc.), and/or can otherwise be implemented.

Inputs to the modeler can include a battery state (e.g., estimated by the state estimator), sensor data (e.g., sensor readings), schedules (e.g., selected models, model noise, etc.), external system properties, battery operation profile (e.g., anticipated load profile, historic load profile, etc.), and/or any suitable inputs can be generated.

Outputs from the modeler can include one or more battery properties, errors in the battery properties, time(s) (e.g., time stamps) associated with the battery properties, and/or any suitable outputs. The outputs are preferably generated by the modeler by processing the inputs according to one or more model.

Figure 7A:
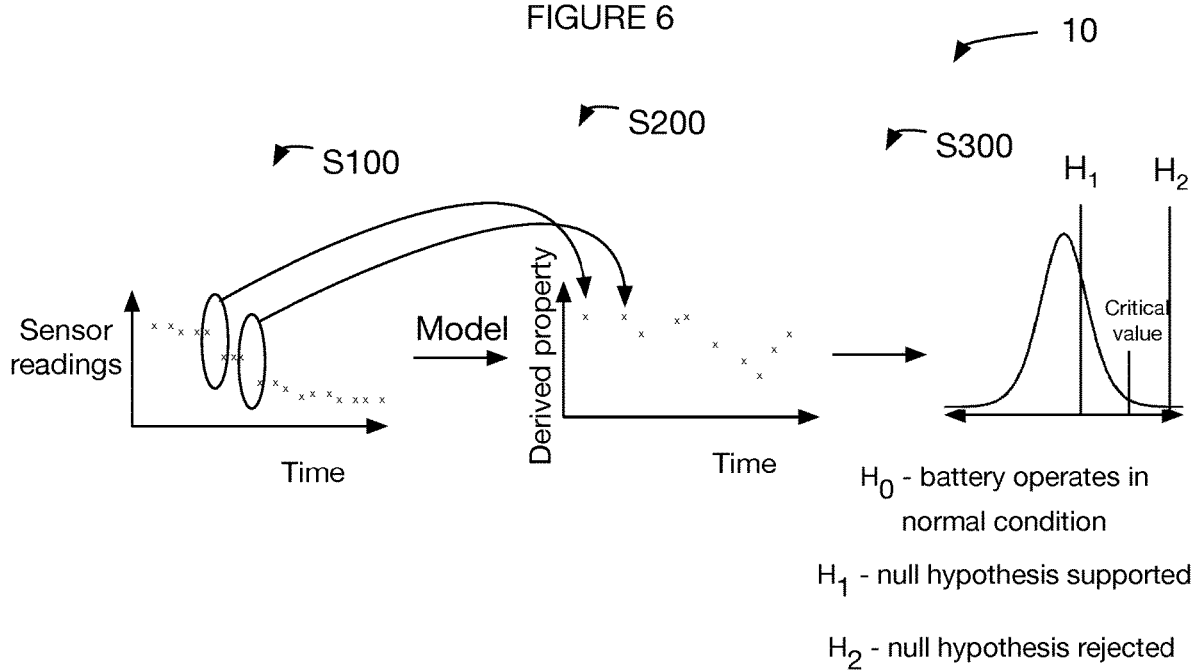
FIG. 7A is a schematic representation of an example of a method operating to detect anomalous behavior based on a jump change.
Figure 7B:
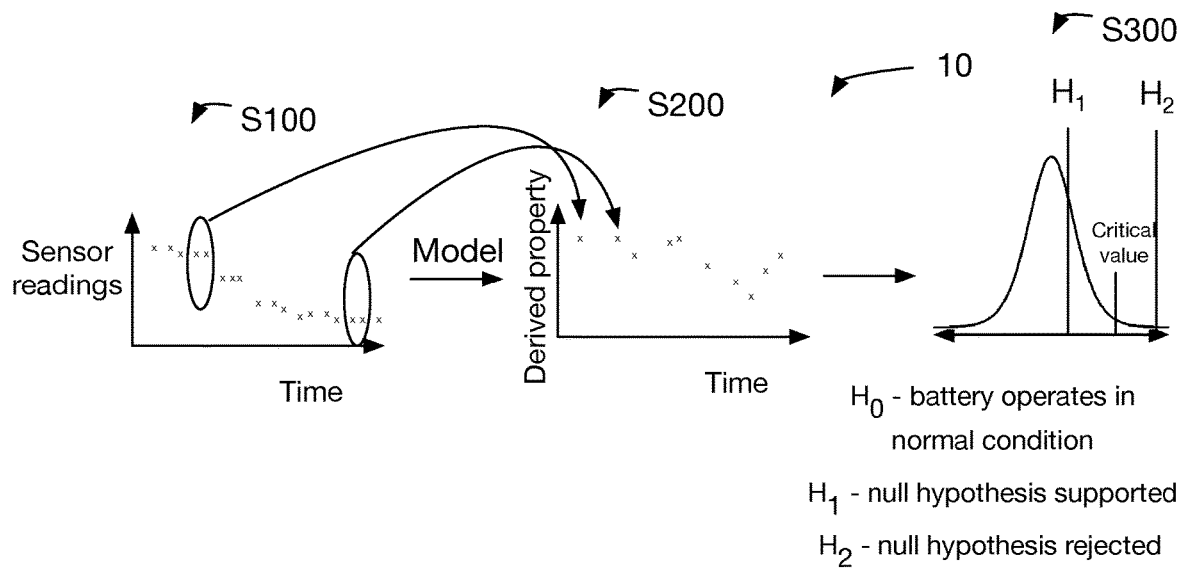
FIG. 7B is a schematic representation of an example of a method operating to detect anomalous behavior based on steady state or battery at rest.
Figure 7C:
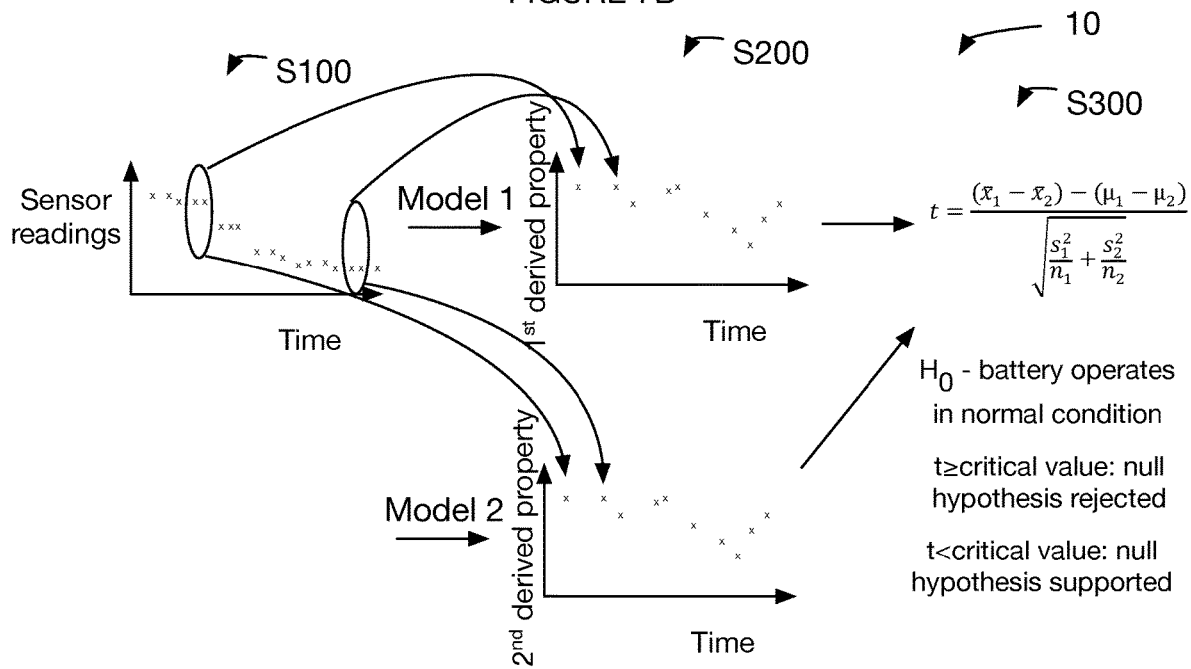
FIG. 7C is a schematic representation of an example of classifying the battery behavior as anomalous based on more than one input.

In variants of the modeler, the modeler can determine the one or more battery properties using (e.g., in combination or isolation) steady state sensor readings (e.g., sensor readings when the data has not experienced a jump larger than a threshold jump for at least a threshold time such as 1 s, 10 s, 1 min, 10 min, 1 hr, 10 hr, values or ranges therebetween, etc.; as shown for example in FIG. 7B; etc.), at rest sensor readings (e.g., sensor readings detected while the battery is not in motion such as determined based on external system sensors), jumps in sensor readings (e.g., at points in time when sensor readings detect a jump in the reading that exceeds a threshold transient such as >0.01 A/s, >0.1 A/s, >0.5 A/s, >1 A/s, >0.01 V/s, >0.1 V/s, >0.5 V/s, >1 V/s, >0.1° C./s, >0.5° C./s, >1° C./s, >5° C./s, >10° C./s, values or ranges therein, similar thresholds for other sensors such as exceeding a minimum detectable change for the sensor by a factor of about 10, 100, 1000, etc.; as shown for example in FIG. 7A; etc.), and/or can be associated with any suitable measurement period. In some variants (as shown for example in FIG. 7C), a plurality of battery properties can be determined (e.g., using a plurality of modelers, using a modeler to determine a plurality of battery properties based on a plurality of models, using a modeler to determine a plurality of battery properties where a battery property is derived from another determined battery property, etc.).

The models can be associated with an anomalous operating condition, a normal operating condition, and/or with any suitable condition(s).

The models used by the modeler can include battery models, sensor models, and/or any suitable models. The sensor model(s) can function to model how sensor data is acquired, an error associated with sensor measurements, sensor biases, and/or otherwise model the sensor behavior. The battery models are preferably physical models (e.g., model a physical aspect of the battery; model battery physics; etc.), but can alternatively be conceptual models or other models. The battery models can function to model (e.g., form a representation of) how the battery operates and/or responds to charging or discharging. For example, battery models can simulate electrical effects, thermal effects, diffusion effects, ion effects, electrochemical effects, and/or any suitable effects.

The models are preferably parameterized models. However, the models can additionally or alternatively include nonparameterized models, machine learning models (e.g., neural networks), and/or any suitable model types. Parameterization generally refers to what independent variables are associated with a dependent variable and a functional form for how the dependent variable changes with the independent variable. Parameterization can additionally or alternatively include: what elements are lumped together (e.g., how many individual units are described by a given term), and/or otherwise be defined. In an illustrative example, open-circuit voltage (U) can be parameterized as a function of state of charge (SoC), temperature (T, e.g., internal temperature of the battery, environmental temperature, etc.), and/or age of the battery such as: U(SoC, T, age), U(SoC, age), U(T, age), U(SoC, T), U(SoC), U(T), U(age), or U; where f(x) means function f of independent variables x.

Each parameterization is preferably associated with a set of parameters, where the set of parameters scale or otherwise relate the independent variable to a dependent variable. For instance, in the parameterization of U(SoC, T)=A*SoC+B*T+C; A, B, and C are the set of parameters.

As a first illustrative example, a capacity (e.g., battery cell capacity) can be modelled as a function of the state of charge. As a second illustrative example, the resistance (e.g., battery cell resistance) can be modelled as a function of the state of charge, the local temperature, and/or a polarization of the battery cell. As a third illustrative example, the battery cell temperature can be modelled as a function of a current temperature dataset, a historic temperature dataset, an ambient temperature (e.g., environmental temperature), and a heat flux (e.g., input heat, heat source, heat sink, thermal gradient, etc.). As a fourth illustrative example, the state of charge can be modelled as a function of a history of use of the battery, an electrical current dataset, a voltage dataset, and/or a temperature dataset. However, any suitable battery properties can be modeled in any suitable manner.

Typically, the independent variables will be associated with (e.g., be, be derived from, be associated with, etc.) one or more sensor measurements. However, the independent variables can additionally or alternatively include: states (e.g., estimated by a state estimator), simulated system properties, and/or any suitable variables.

Figure 9:
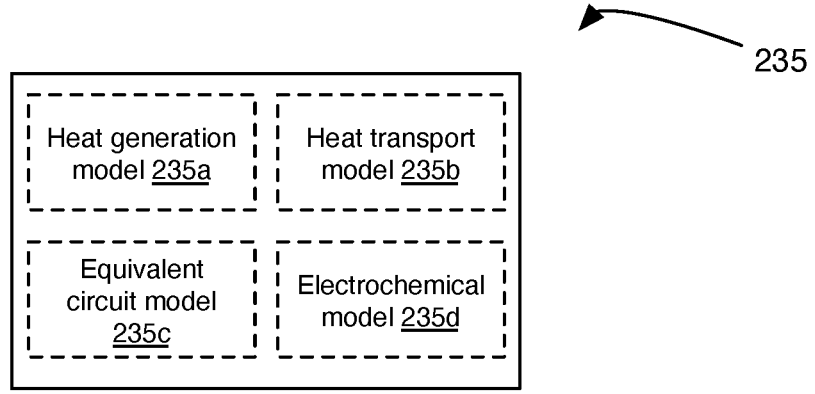
FIG. 9 is a schematic representation of an example of a battery cell model.
Figure 10:
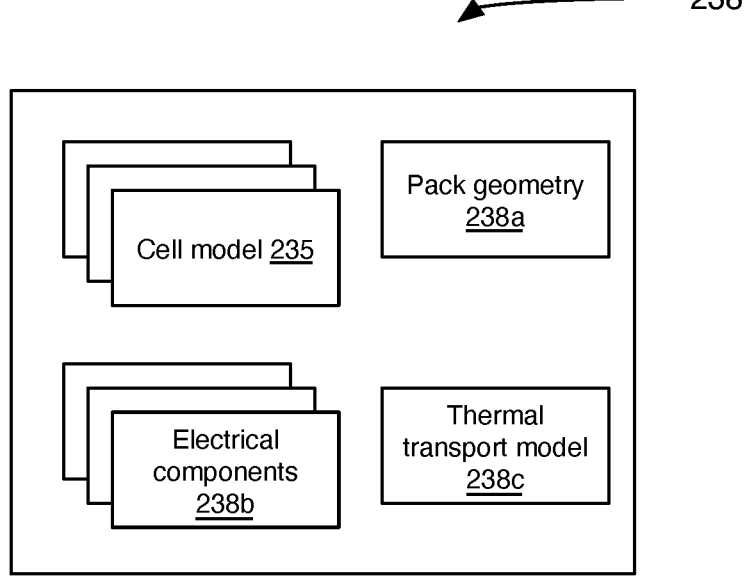
FIG. 10 is a schematic representation of an example of a battery pack model.

Each model can be associated with one or more submodels. The submodel(s) are preferably distinct (e.g., covariance between models is low), but can be integrated (e.g., have a non-negligible covariance with other submodels). The submodels can include physical models, nonphysical models, and/or any suitable models. The submodels can include local models 235 (e.g., cell models that are specific to a cell, specific to a module, specific to a predetermined number of cells, specific to an external system, specific to a portion of an external system proximal the battery, as shown for example in FIG. 9, etc.), a battery pack model 238 (e.g., including or accounting for each cell of a pack separately or collectively, accounting for each cell in series within a pack, as shown for example in FIG. 10, etc.), a battery module model, an external system model, and/or any suitable models. The submodel(s) can be lumped model(s) (e.g., lumped element models), finite element model(s), numerical model(s), continuous model(s), single particle model(s), and/or any suitable model(s). The submodel(s) can include, for example, a thermal model 238c (e.g., a model for determining the thermal distribution within a battery, battery pack, cell, external system, etc.), a heat generation model 235a (e.g., a model for how much heat is generated during operation of the battery), an electrical model 235c (e.g., RC model, R model, C model, inductance model, equivalent circuit model, etc.), an electrochemical model 235d (e.g., a model for distribution of ions), a heat transport model 235b (e.g., a model for how heat is transported within and/or between components), a degradation model, an ion transport model (e.g., $Li^+$ transport model), a kinetic model (e.g., for how a system evolves in time, for how a system achieves a thermodynamic equilibrium, etc.), a thermodynamic model (e.g., for an equilibrium state of the battery or system), a pack geometry model 238a (e.g., a model or representation for how components of the battery pack are spatially arranged, connected, etc.), an electrical components model 238b (e.g., a model or representation for how components operate, are electrically connected, etc.), a quantum mechanical model, and/or any suitable models.

The classifier preferably functions to classify a battery behavior as anomalous (e.g., detect anomalous behavior, predict anomalous behavior, determine whether a battery is operating in an anomalous condition with a threshold confidence, etc.). The classifier is preferably implemented as part of a local computing system. However, additionally or alternatively the classifier can be implemented as part of a remote computing system (e.g., run on a cloud server), can be distributed (e.g., run on a local and remote computing system, include a first local classifier and a second remote classifier, etc.), and/or can otherwise be implemented.

Inputs to the classifier can include battery properties (e.g., as modeled, estimated, determined, calculated, etc. by a modeler), battery states (e.g., estimated by the state estimator), sensor data (e.g., sensor readings), schedules (e.g., selected models, model noise, etc.), external system properties, battery operation profile (e.g., anticipated load profile, historic load profile, etc.), and/or any suitable inputs can be generated.

The classifier preferably processes a time series of battery properties 232 (and/or battery states in variants that receive battery states from a state estimator), but can process individual battery properties. The total number of battery properties with the time series of battery properties can be fixed or variable. The total number of battery properties can depend on a processor bandwidth, a mode of operation (e.g., more time points for higher accuracy mode, fewer properties for lighter processor application, etc.), a type of battery anomaly to be detected, a false positive and/or false negative target, and/or can depend on any suitable information. The time series of battery properties preferably includes between 2-100 battery property values (e.g., at different times, for a given battery property, total across different battery properties, etc.). However, the classifier can process more than 100 battery property values (e.g., about 100 battery properties for each battery property that is used in the classification).

When additional battery properties are generated (e.g., after the classifier has processed a threshold number of battery properties), a new time series of battery properties can be started, battery properties from the time series of battery properties can be removed starting with the oldest battery property(s), a larger time series of battery properties can be evaluated (e.g., with greater than the threshold number of battery properties), and/or additional battery properties can otherwise be evaluated and/or included in a time series of battery properties.

The time series of battery properties can have an equal or unequal time separation between battery property values. In some variants, the time series of battery properties can be interpolated between and/or extrapolated from to estimate battery properties, the battery properties can be fit to a function, the battery properties can be resampled (e.g., to a sampling frequency), and/or the battery properties can otherwise be evaluated or manipulated for classification.

Outputs from the classifier can include a classification of battery operation (e.g., binary classification such as anomalous or normal; a specification classification such as a type of battery anomaly, etc.), flags or alerts (e.g., normal behavior flag; anomalous behavior flag; specific predicted anomalous condition such as cell disconnection, thermal anomaly, thermal disconnection, electrical shorting, etc.; etc.), a confidence in a classification, a second classifier recommendation (e.g., to verify or double check the classifier results), an estimated time since the battery operation has changed, a severity of anomalous condition, and/or can include any suitable outputs.

The classifier preferably uses a statistical test to classify the battery operation. However, the classifier can additionally or alternatively use a threshold (e.g., when a threshold number of sensor readings and/or battery properties exceed a threshold value, the classifier can identify anomalous battery behavior), Bayesian testing, Gaussian models, a machine learning algorithm (e.g., neural network such as convolutional neural networks, feed forward neural networks, recurrent neural network, etc.; decision tree; K-nearest neighbors; support vector machines; clustering; etc.), Kalman filter (e.g., trained to classify one or more states), time series classifier (e.g., a neural network with memory, autoregressive integrated moving average (ARIMA), etc.), and/or using any suitable classification algorithm(s). Examples of statistical tests can include: student's t-test (e.g., a single sample t-test, a double sample t-test, directional t-test, nondirectional t-test, Hotelling's t-squared statistic, etc.), Z-test, F-test, Neyman-Pearson hypothesis testing, chi-squared test, likelihood-ratio test, G-test, Kruskal-Wallis test, parametric analysis of variance (ANOVA), and/or any suitable statistical test(s) can be used.

The critical value (e.g., the value that a test statistic is compared to, where the test statistic is derived from the time series of battery properties based on the statistical test used) for the statistical test can depend on a type of anomaly to detect, a severity of anomaly to detect, a target false positive rate, a target false negative rate, a total number of battery properties to be evaluated at a time by the classifier, and/or can be otherwise selected. For instance, a critical value (e.g., p value) of 0.05, 0.01, 0.005, 0.001, 0.0005, 0.0001, 0.00005, 0.00001, 0.000005, 0.000001, 0.0000005, 0.0000001, 0.00000005, 0.00000001, and/or any suitable critical value can be used.

In some variants, the system can include more than one classifier, which can be beneficial for providing redundancy (e.g., in case of an error in a classifier), can improve a classification (e.g., a second classifier can be used to verify a classification, where the second classifier is typically more computationally complex and/or evaluates more data than the initial classifier used to make the assessment), and/or can provide any suitable technical advantage. In variations of these variants, a classifier can change a mode of operation (e.g., from a quick or simple classification to a validation, verification, higher accuracy, etc. classification). In one specific example, a different classifier can be used to classify battery operation for each anomalous behavior to be monitored (e.g., a cell disconnect classifier, a cell shorting classifier, a thermal anomaly classifier, a thermal disconnection classifier, etc.). In a second specific example, a first classifier can be used to generate an 'on-battery' classification and a second classifier can be used to verify the 'on-battery' classification (e.g., operating in a remote computing system). In a third specific example, two 'on-battery' classifiers can be used, where one can be dormant until the first classifier identifies a potential anomaly, where the dormant classifier can come online when the first classifier identifies the potential anomaly. However, any suitable number and/or combination of classifiers can be used.

When multiple classifiers are used, a detection of anomalous behavior can be made by voting (using each classifier's classification of the battery condition), based on a classifier priority (e.g., classified in accord with a highest priority classifier), after a plurality or majority of classifiers have made the same classification, and/or can otherwise be combined and/or used to determine a classification.

As a first illustrative example, a classifier can determine whether a cell is disconnected within a battery pack by comparing a test statistic derived from a time series of capacity and/or resistance to a critical value (e.g., where a cell disconnect can be determined with a confidence approximately equal to the critical value when the test statistic is greater than or equal to the critical value). In a second illustrative example, a classifier can determine whether a battery is experiencing a thermal anomaly (e.g., thermal runaway, anomalous heat sources or sinks, etc.) by comparing a test statistic derived from a time series of temperature (e.g., local temperature) and/or resistance to a critical value (e.g., where a thermal anomaly can be determined with a confidence approximately equal to the critical value when the test statistic is greater than or equal to the critical value). In a third illustrative example, a classifier can determine whether a thermal disconnection (e.g., a loss of thermal connection such as due to thermal paste degradation, material flexure, etc.) is present within a battery pack by comparing a test statistic derived from temperature (e.g., local temperature) and/or variable that depends on temperature (e.g., resistance, open circuit voltage, short circuit current, capacity, state of charge, etc.) to a critical value (e.g., where a thermal disconnect can be determined with a confidence approximately equal to the critical value when the test statistic is greater than or equal to the critical value). In a fourth illustrative example, a classifier can determined whether a battery cell is short circuit within a battery by comparing a test statistic derived from an electrical current and/or state of charge to a critical value (e.g., where a cell short circuit can be determined with a confidence approximately equal to the critical value when the test statistic is greater than or equal to the critical value). Typically, in the first and third specific examples, the sensor measurements used to derive the battery properties are measured when the battery is experiencing steps and/or changes in the electrical environment (e.g., current draw, discharge, etc.) and/or in the thermal environment (e.g., a change in the temperature external to the battery system, a change in the internal temperature of the battery system such as by turning on or off a thermal management system, etc.). Typically, in the second and fourth specific examples, the sensor measurements used to derive the battery properties are measured when the battery is operating in steady state conditions (e.g., steady state draw, steady state rest, etc.). However, any suitable data can be used in any of the specific examples.

Examples of test statistics that can be used include:

$$t = \frac{\bar{x}_1 - \mu_1}{\sqrt{\frac{s_1^2}{n_1}}},$$

where t can be the test statistic, $x_1$ can be the sample mean for the analyzed battery property, $\mu_1$ can be the population mean, $s_1$ can be the sample standard deviation for the analyzed battery property, and $n_1$ can be the sample size;

$$t = \frac{(\bar{x}_1 - \bar{x}_2) - (\mu_1 - \mu_2)}{\sqrt{\frac{s_1^2}{n_1} + \frac{s_2^2}{n_2}}},$$

where t can be the test statistic, $x_1$ can be the sample mean for the first analyzed battery property, $\mu_1$ can be the population mean for the first analyzed battery property, $s_1$ can be the sample standard deviation for the first analyzed battery property, $n_1$ can be the sample size for the first analyzed battery property, $x_2$ can be the sample mean for the second analyzed battery property, $\mu_2$ can be the population mean for the second analyzed battery property, $s_2$ can be the sample standard deviation for the second analyzed battery property, and $n_2$ can be the sample size for the second analyzed battery property; and/or any suitable test statistic can be used (e.g., making simplifying assumptions based on relative variances of different battery properties, using an ANOVA test statistic, etc.).

The classifier can be trained using laboratory data (e.g., operating a plurality of batteries across a plurality of conditions to elicit anomalous behavior, i.e., a training data set, where the classifier can be trained to identify the anomalous behavior using the training dataset), using simulated data (e.g., based on a simulation of a battery output for given operation conditions such as disclosed in U.S. patent application Ser. No. 17/314,867, titled 'BATTERY ANALYSIS SYSTEM AND METHOD' filed 7 May 2021 which is incorporated in its entirety by this reference; using a state estimator; etc.), and/or can be trained in any manner. The training can be supervised and/or unsupervised.

In variants, the computing system (and/or components thereof such as the modeler, scheduler, state estimator thereof) can operate in different modes of operation. Examples of modes of operation include a high accuracy mode (e.g., a condition optimized, trained, operable to, etc. detect an anomalous battery operation with a high accuracy such as ≥99% confidence, ≥99.9% confidence, ≥99.99% confidence, ≥99.995% confidence, <1 false negative/hr, <1 false negative/day, etc.), a low accuracy mode (e.g., a condition optimized, trained, operable to, etc. detect an anomalous battery operation with an accuracy such as ≥90% confidence, ≥80% confidence, ≥75% confidence, ≥95% confidence, <10 false negatives/hr, <50 false negatives/hr, etc.), high performance mode (e.g., a condition optimized, trained, operable to, etc. classify a battery behavior in an unconstrained compute system, a mode that draws a higher power to ensure a proper classification, etc.), a low performance mode (e.g., a condition optimized, trained, operable to, etc. to classify a battery operation condition in a compute constrained environment), a high precision mode (e.g., a condition optimized, trained, operable to, etc. for high precision battery operation classification), a low precision mode (e.g., a condition optimized, trained, operable to, etc. for low precision battery operation classification), a deterministic mode (e.g., a condition that given the same inputs will generate the same outputs), a probabilistic mode (e.g., a condition that can generate different outputs for the same inputs such as by probabilistic selection of a mode from a schedule), a charging mode (e.g., a condition to be used when the battery is charging), a discharging mode (e.g., a condition to be used when the battery is discharging), a static mode (e.g., a condition to be used when a battery is not in use), a steady state mode (e.g., a mode that operates when the battery and/or system is at rest, operating in steady state conditions, etc.), step mode (e.g., a mode that operates when the battery and/or battery system experiences a jump change such as a variable change that exceeds a threshold change in less than a threshold amount of time), and/or any suitable mode(s) of operation.

The computing system (and/or component(s) thereof) can automatically change between modes (e.g., upon detection that a computation bandwidth changes an accuracy and/or precision mode can be changed; upon detection that a motion state such as from steady state to non-steady state or vice versa based on an IMU sensor reading, a sudden change in current draw and/or temperature, etc.), can be changed according to a predetermined timing (e.g., at predetermined times, at a predetermined frequency, etc.), can be changed responsive to a signal (e.g., battery operation classification, threshold sensor measurement, threshold state determination, etc.), can be changed manually (e.g., by an operator), can be fixed (e.g., set once and not changed), and/or can otherwise be selected and/or changed.

In one illustrative example of a computing system operating in a plurality of modes, a computing system (e.g., modeler, classifier) can operate in a steady state mode where the computing system determines battery property(s) and/or classifies a battery operating condition based steady state sensor readings (e.g., sensor measurements made during steady state operation) and a jump change mode (e.g., where the computing system determines battery property(s) and/or classifies a battery operating condition based on jump changes in battery and/or system operation). In a second illustrative example, a computing system (e.g., modeler, classifier) can operate in a rapid detection mode (e.g., a low accuracy mode, a mode that classifies the battery operation based on a small number of inputs such as 2, 3, 5, 7, 11, 15, 21 battery properties, a mode that can run on-board the system, etc.) which can in real or near-real time (e.g., with anomaly occurrence such as within a threshold time such as seconds, minutes, hours, etc. of an anomaly occurring; during battery operation; etc.) determine a battery operating condition (e.g., detect anomalous behavior) and a high precision mode, a high accuracy, and/or a delayed mode which can verify a classification from the rapid detection mode and/or provide a higher accuracy classification of a battery condition (e.g., by processing a larger number of inputs than the rapid detection mode, by operating in a compute unconstrained environment such as on a cloud server, by using more accurate and/or complex models, etc.). In variations of the second specific example, the two modes can operate simultaneously, the high precision, high accuracy, and/or delayed mode can operate in response to a classification from the rapid detection mode of anomalous battery behavior, and/or the two modes can be used in any manner.

4. Method.

The method preferably functions to determine a battery condition. However, the method can additionally or alternatively function to predict a future battery condition, a duration of a battery condition, a time until a battery is predicted to be in a battery condition, and/or can otherwise function. The method is preferably performed in real or near-real time (e.g., relative to a sensor latency, to a battery-operated system operation time, etc.), but can be performed delayed and/or with any suitable timing. The method (or steps thereof) are preferably performed automatically (e.g., continuously), but can be performed responsive to a trigger, a request or call for method operation, manually (e.g., responsive to a request from an operator or user), and/or with any suitable timing.

The method is preferably performed by a local computing system (e.g., a computing system operating on a battery powered system, device, etc.), but can additionally or alternatively be performed by a cloud computing system and/or using a distributed computing system (e.g., distributed between one or more local computing systems, between a local and remote computing system, etc.). The computing system can include any suitable processor(s), central processing unit, graphics processing unit, tensor processing unit, floating point unit, arithmetic logic unit, microprocessor, microcontroller, and/or any suitable processing units. The method and/or steps thereof can be performed using fixed point arithmetic (which in some variants can provide a technical advantage for a high processing speed, low power consumption, low memory need, low bandwidth requirement, small chip area, etc.), floating point arithmetic, logarithmic number systems, tapered floating-point representations, arbitrary precision arithmetic, interval arithmetic, symbolic algebra system, and/or using any suitable representation(s). For example, the method can be performed by a system as disclosed above.

Receiving sensor measurements S100 functions to receive a time series of sensor measurements associated with a battery of the battery-operated system. The sensor measurements are preferably made by a sensor, but can be made by any suitable component. The sensor measurements can be received from the sensor, received from a computing system (e.g., memory, storage, etc.), and/or from any suitable component. The sensor measurements are typically non-local measurements (e.g., are not tied to a specific battery cell) but can be local measurements (e.g., one or more sensor measurements for each battery cell). In variants, each cell of a battery can include a sensor, each module of a battery can include a sensor, each battery pack can include a sensor, a subset of cells can include a sensor, a subset of modules can include a sensor, a subset of packs can include a sensor, and/or the sensor can otherwise be associated with any suitable battery(s).

Examples of sensor measurements include: temperature (e.g., average temperature, instantaneous temperature, surface temperature, internal temperature, etc.), pressure, force (e.g., impact), voltage (e.g., instantaneous voltage, open circuit voltage, etc.), current (e.g., instantaneous current, short circuit current, etc.), and/or any suitable sensor data. Exemplary sensors include: battery management systems (BMS) monitors, thermometers, pressure gauges, external system sensors (e.g., odometers, altimeters, power sensors, etc.), anemometer, weather sensors (e.g., illumination sensors, humidity sensors, road condition sensors, etc.), clocks, electrochemical impedance spectroscopy (EIS) sensors, voltmeters, ammeters, ohmmeter, multimeter, and/or any suitable sensors.

The number of sensor measurements can depend on a model complexity (e.g., a complexity of a model used in S200), a battery complexity (e.g., number of battery cells within a battery module or battery pack, arrangements of battery cells, battery chemistry, etc.), an application of the battery-operated system, a processor property (e.g., processor memory, memory allocation, speed, arithmetic format, etc.), and/or can depend on any suitable condition(s). The time series preferably includes between about 10 and 100 sensor measurements, but can include fewer than 10 sensor measurements and/or greater than 100 sensor measurements.

A time series of sensor measurements can include measurements from one or more sensors. For example, a time series of sensor measurements can include one or more of a current measurement, a voltage measurement, and/or a temperature measurement. Sensor measurements from different sensors can be temporally aligned (e.g., to start at a common reference time), synchronized, asynchronous, associated with a time stamp, and/or can otherwise be related.

The sensor measurements are preferably equally spaced, but can be unequally spaced (e.g., sensor latency can be variable, sensor can fail to acquire data during one or more measurement iterations, etc.). For example, the sensor measurements are preferably received at a frequency that is at least 0.1 Hz (e.g., 0.1 Hz, 0.5 Hz, 1 Hz, 5 Hz, 10 Hz, 50 Hz, 60 Hz, 100 Hz, 120 Hz, 200 Hz, 1000 Hz, values or ranges there between, etc.), but can be received at a frequency that is less than 0.1 Hz.

Determining battery properties S200 functions to calculate (e.g., estimate, compute, approximate, determine, etc.) one or more battery properties from the sensor measurements (e.g., sensor measurements received in S100). The battery properties are preferably determined using a computing system (e.g., a modeler, an estimator, etc.), but can be determined using any suitable component. The battery properties are preferably associated with (e.g., representative of, proportional to, related to, correlated with, cause, etc.) the battery conditions (e.g., determined in S300), but can be associated with the battery-operated system conditions and/or any suitable conditions.

Examples of battery properties can include: voltage (e.g., open circuit voltage, instantaneous voltage, end-of-life voltage, beginning of life voltage, voltage limits, etc.), current (e.g., short circuit current, instantaneous current, end-of-life current, beginning-of-life current, current limits, taper currents, etc.), temperature (e.g., internal temperature, surface temperature, environment temperature, set temperature, local temperature, average temperature, etc.), temperature gradient, humidity, pressure (e.g., environmental pressure, mechanical pressure, air pressure, etc.), resistance (e.g., internal resistance, ohmic resistance, capacitive resistance, inductive resistance, etc.), impedance, capacity (e.g., specific capacity), capacitance (e.g., effective capacitance), inductance, component thickness (e.g., anode thickness, cathode thickness, separator thickness, solid-electrolyte interface layer thickness, etc.), particle radius (e.g., anode particle radius, cathode particle radius), transference number, Brugman number, solution diffusivity, solution volume fraction (e.g., anode, cathode, separator, etc. solution volume fraction), diffusivity (e.g., anode solid diffusivity, cathode solid diffusivity, etc.), reaction rate (e.g., anode reaction rate, cathode reaction rate, etc.), materials (e.g., cathode material, anode material, electrolyte material, separator, etc.), geometry, solution conductivity, entropic heating coefficient, thermal conductivity, electrical conductivity, thermal mass, C-rate (e.g., nominal C-rate, maximum C-rate, etc.), charge (e.g., maximum charge, charge current limit, discharge current limit, delivered charge, stored charge, etc.), state (SoX) of the battery (e.g., state of charge (SoC), state of health (SoH), state of power (SoP), state of safety (SoS), etc.), energy (e.g., energy delivered since last charge or discharge, total energy delivered for a given period of time, etc.), time (e.g., time since last charge or discharge, age, remaining lifetime, etc.), ion concentration (e.g., lithium ion concentration), and/or any suitable properties.

The battery properties are preferably calculated using a model. The model is preferably a lightweight model (e.g., only includes simple arithmetic operations such as addition, subtraction, multiplication, division, rounding, determining minimum, determining maximum value, etc.), which can be beneficial for operating in a constrained computation environment, for decreasing a complexity of the calculation, enhancing a speed of the computation, and/or can otherwise be beneficial. However, any suitable model (e.g., including more complex mathematical operations such as transformations, vector manipulation, etc.) can be used. A complexity of a model can depend on a target accuracy of the battery property determination (e.g., a more complex model can improve an accuracy, a target accuracy to determine a battery condition, etc.), a processing system (e.g., available processing power, bandwidth, computational complexity, etc.), and/or any suitable information. In some variants, a model complexity can be updated (e.g., when a compute availability increases or decreases to increase or decrease a model complexity where a more complex model is typically associated with a more accurate battery property and typically a greater processing bandwidth).

In some variants, S200 can include selecting one or more models (e.g., from a set of models, a model library, etc.). For instance, a normal operation model (e.g., a model trained using battery(s) operating in normal conditions) and an anomalous operation model (e.g., a model trained using battery(s) operating in anomalous conditions) can be selected. The models can be selected randomly, based on a feared anomalous event (e.g., thermal anomaly, thermal runaway, cell disconnect, cell short, etc.), based on the battery (e.g., anode or cathode type, SoC, SoH, age, operation time, number of cycles, etc.), based on the instantaneous battery operation (e.g., at rest, charging, discharging, etc.), based on the battery properties (e.g., calculated battery properties, battery properties to be determined, etc.), and/or can otherwise be selected.

The model is preferably a physical model (e.g., including a mathematical model, including physical relationships between components, based on an electrical diagram, based on a thermal diagram, based on a chemical relationship, etc.), but can additionally or alternatively include and/or be a schematic model, and/or any suitable model type. The model is preferably a lumped model (e.g., lumped element models), but can be finite element model, numerical model, continuous model, single particle model, and/or any suitable model. The model can include, for example, a thermal model (e.g., a model for determining the thermal distribution within a battery, battery pack, cell, external system, etc.), a heat generation model (e.g., a model for how much heat is generated during operation of the battery), an electrical model, an electrochemical model, a heat transport model (e.g., a model for how heat is transported within and/or between components), a degradation model, an ion transport model (e.g., $Li^+$ transport model), a quantum mechanical model, and/or any suitable models. As a simplified example, a physical model for ohmic resistance can be provided as $R=V/I$ (e.g., where R is the resistance, V is the voltage, and I is the current). In a second exemplary model, the ohmic resistance can be modelled as a function of battery state of charge, internal temperature (e.g., which can be a modelled value or a measured value), current, voltage, ion distribution within the battery, ion diffusion within the battery, and/or any suitable term(s) or combinations. However, any suitable model(s) can be used.

Inputs to the model can include: sensor measurements (e.g., as received in S100), model parameters (e.g., tuned model parameters), model parameterization, battery lifetime (e.g., total time of use, total expected lifetime, total time operating in a given application instance, etc.), a battery state (e.g., determined by a state estimator, most recently estimated battery state, state of charge (SoC), state of health (SoH), state of power (SoP), state of safety (SoS), etc.), and/or any suitable inputs can be provided to the model.

The model can process sensor measurements associated with steady state readings and/or jumps in data readings. For example, resistance datum can be computed from sensor measurements associated with a sufficiently large current spike (or current jump). A nonlimiting example of a sufficiently large current spikes can include current spikes that is at least about 1 A/s (e.g., 1 A change that lasts for 1 s, 0.5 A change that lasts for 0.5 s, etc. such as 1 A/s, 2 A/s, 5 A/s, 10 A/s, 20 A/s, etc.). However, a current spike can additionally or alternatively be less than 1 A/s (e.g., 0.5 A/s, 0.1 A/s, etc.). A sufficiently large current spike can depend on a model (e.g., to be used in S200), a battery condition to be monitored (e.g., electrical condition, thermal condition, thermodynamic condition, etc.), a battery application (e.g., charging rate, discharging rate, charging duration, discharging duration, etc.), a battery property to be computed, a mode of operation, and/or can depend on any suitable conditions. However, in some variants, the datum (every datum, a subset of datum, etc.) do not need to be associated with a current spike.

Outputs from the model preferably include one or more battery properties. However, the model can output any suitable information (e.g., information used to determine one or more additional or alternative battery properties).

In some variants, any suitable model(s) and/or submodels such as those disclosed in U.S. patent application Ser. No. 17/502,565 entitled 'BATTERY ANALYSIS SYSTEM AND METHOD' filed 15 Oct. 2021 which is incorporated in its entirety by this reference can be used.

However, in some variants, the battery properties can additionally or alternatively be calculated using a state estimator (e.g., a Kalman filter, an extended Kalman filter, an unscented Kalman filter, a state estimator as disclosed in U.S. patent application Ser. No. 17/502,565 entitled 'BATTERY ANALYSIS SYSTEM AND METHOD' filed 15 Oct. 2021 which is incorporated in its entirety by this reference, etc.; a state estimator that uses the model to predict future states of the battery; etc.) and/or using any suitable process.

The battery property(s) are preferably determined for each datum of the sensor measurements, but can be determined for a subset of datum and/or for any suitable information. When a state is used for determining the battery property, the same state value can be used for each datum of the sensor measurements, the current state value can be used (e.g., the most recently available state value can be used for a given time point such as using different states when the state is updated during the time series of sensor measurements), battery properties can be updated based on a current state (e.g., previously computed battery properties can be updated when an updated battery state is available), and/or the battery properties can be determined in any manner based on the battery state.

Figure 2:
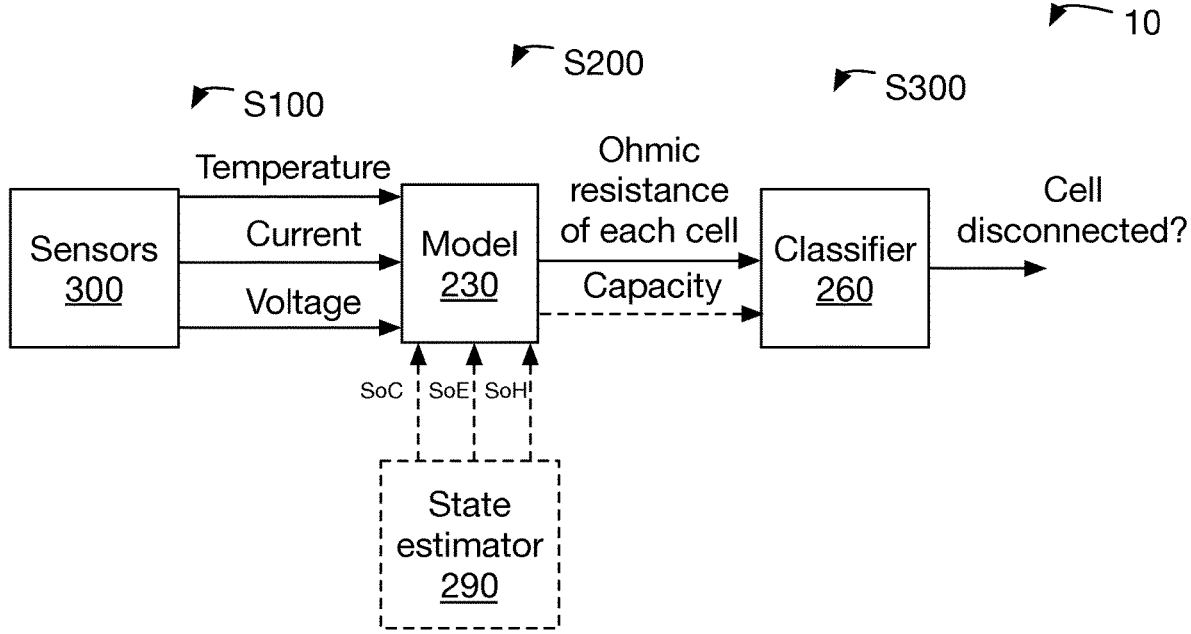
FIG. 2 is a schematic representation of an example of the method.

As a first illustrative example (as shown for instance in FIG. 2), sensor measurements (e.g., temperature, voltage, current, etc.) and/or state estimates (e.g., state of charge) can be used to estimate an ohmic resistance of the battery (e.g., of the battery as a whole, of one or more cells of the battery, etc.). In variants of the first illustrative example, one or more states (e.g., states estimated using a state estimator using the same model, a client state estimator, a remote state estimator, an embedded state estimator, a state estimator operating a more complex model, a state estimator using a simpler model, etc.) can be provided to estimate the ohmic resistance.

Figure 3:
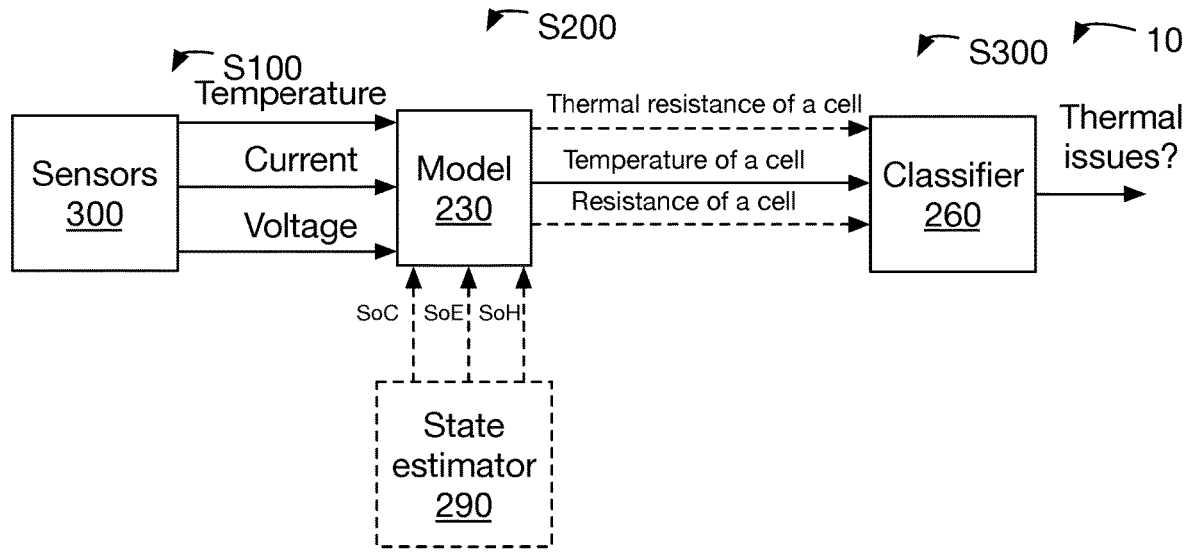
FIG. 3 is a schematic representation of an example of the method.

As a second illustrative example (as shown for instance in FIG. 3), sensor measurements (e.g., temperature, voltage, current, etc.) can be used to estimate an internal temperature of the battery (e.g., of the battery as a whole, of one or more cells of the battery, etc.) and/or components of the battery-operated system (e.g., proximal the battery, processor(s) within a threshold distance of the battery, heat sinks, heat sources, etc.). In variants of the second illustrative example, one or more states (e.g., states estimated using a state estimator using the same model, a client state estimator, a remote state estimator, an embedded state estimator, a state estimator operating a more complex model, a state estimator using a simpler model, etc.) can be provided to estimate the internal temperature.

However, any suitable battery properties can be determined using any suitable model(s).

Determining a battery condition S300 functions to determine (e.g., estimate, calculate, approximate, compute, etc.) the battery condition based on the battery property(s) (e.g., as determined in S200). The battery condition is preferably determined by the computing system (e.g., a classifier, a statistical modeler, an artificial intelligence module, etc. thereof), but can be determined by any suitable component. The battery condition preferably includes an anomalous operation of the battery, but can include any suitable battery condition. For example, the battery condition can include (e.g., can indicate, suggest, etc.) cell disconnection (e.g., number of cells connected, number of cells disconnected, number of cells in series, number of cells in parallel, etc.), electrical shorting (e.g., an electrical short between battery cells, electrical short within a battery cell, electrical short within a battery module, electrical short within a battery pack, etc.), a thermal event (e.g., a temperature of the battery exceeding a threshold temperature; a temperature of components proximal the battery exceeding a threshold temperature; a temperature of a battery cell exceeding a temperature threshold; a thermal disconnection within a battery such as a substantial change in connection to a thermal management system such as a heat sink, heating element, cooling element, etc.; etc.), and/or any suitable battery condition can be determined. In some variations, the threshold(s) (e.g., temperature thresholds) can vary. For instance, a temperature threshold can be a value that is predicted (e.g., based on the model) to lead to a fire or an explosion. However, the thresholds can be static and/or can otherwise be determined or set.

Figure 4:
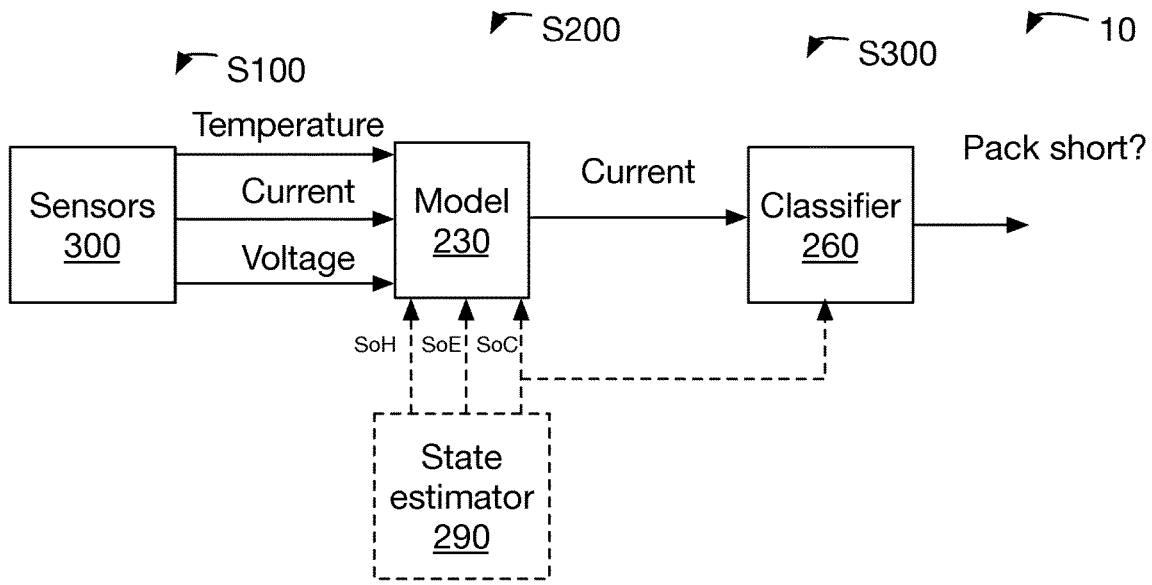
FIG. 4 is a schematic representation of an example of the method.

The battery condition can be determined based on the battery property(s) (e.g., as determined in S200), the sensor measurements (e.g., as received in S100), one or more state(s) (e.g., determined by a state estimator, as shown for example in FIG. 4, etc.), and/or using any suitable information.

Determining the battery condition can include classifying the battery condition based on the battery property(s). The battery condition can be classified as a probability that the battery is in a condition, the probability that a battery condition is associated with a given classification, and/or can otherwise be classified. A classifier used to classify the battery condition can be a binary classifier, a multi-class classifier, a Bayesian classifier, artificial intelligence, and/or any suitable classifier can be used.

The battery condition is preferably classified repeatedly, but can be classified a single time (e.g., responsive to a request for battery condition classification), and/or with any suitable timing. The battery condition can be classified at the measurement frequency, for a subset of measurements (e.g., every 5 measurements, every 10 measurements, etc.), at predetermined times, at a predetermined frequency, responsive to a trigger, randomly or pseudorandomly, and/or with any suitable timing or frequency. Each classification is preferably independent. However, one or more classifications can depend on other classifications (e.g., a prior classification can be provided to a subsequent classification).

The same classifier can be used to classify multiple battery conditions, a different classifier can be used to classify each battery condition (e.g., each battery condition to be classified), and/or any suitable classifier(s) can be used to classify the battery condition.

The battery condition can be classified using a statistical test, Bayesian analysis, artificial intelligence, and/or using any suitable test and/or process. Examples of statistical tests that can be performed on the battery properties and/or states can include: t-test, Neyman-Pearson hypothesis testing, z-test, chi-squared test, F-test, likelihood-ratio test, G-test, and/or any suitable statistical test(s) can be used.

In some variations, S300 can include determining a statistical probability (e.g., from a statistical test) associated with each of a plurality of battery models (e.g., battery models associated with normal operation and anomalous operation(s)). The battery operation can then be classified as normal or anomalous based on the statistical probability associated with each model (e.g., with classification matching the model with the largest statistical probability). As an illustrative example, a statistical probability could be determined based on battery properties computed using a normal operation model, a thermal anomaly model, and a cell short circuit model. In this illustrative example, when the normal operation model has the greatest statistical probability, the battery can be classified as normal operation; similarly, when the thermal anomaly or cell short circuit model has the greatest statistical probability, the battery can be classified as anomalous operation (e.g., thermal anomaly or cell short circuited respectively).

The battery condition is preferably misidentified (e.g., a false positive rate such as identifying a cell disconnection when there is no disconnection, thermal issues when the temperature is normal, electrical shorting when no short is present, etc.; a false negative rate such as indicating that no disconnection has occurred when a cell is disconnected, a normal temperature when a thermal issue is present, no electrical short when a cell is shorted, etc.; etc.) at most $10^{-6}$ times/hour (e.g., $10^{-7}$/hour, $10^{-8}$/hour, $10^{-9}$/hour, etc.). However, any suitable misidentification rate can be achieved (e.g., in non-safety critical operations, a lower misidentification rate can be achieved). The misidentification rate can depend on the battery properties (e.g., model accuracy), a classifier (e.g., type of classifier), sensor measurements (e.g., sensor errors, sensor bias, sensor accuracy, sensor rate, sensor latency, etc.), a processor property (e.g., bandwidth, arithmetic format, etc.), and/or can depend on any suitable information.

Figure 5A:
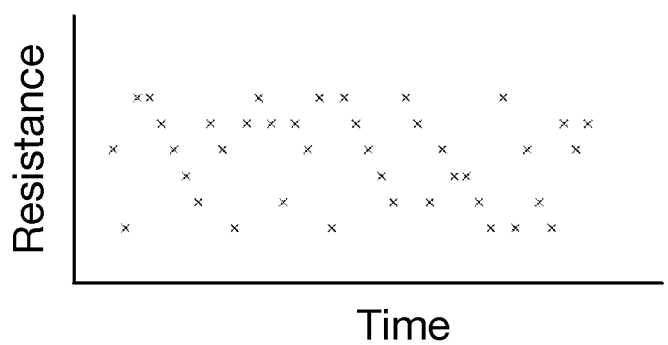
FIG. 5A is a schematic representation of exemplary battery resistance for a battery without a disconnection.
Figure 5B:
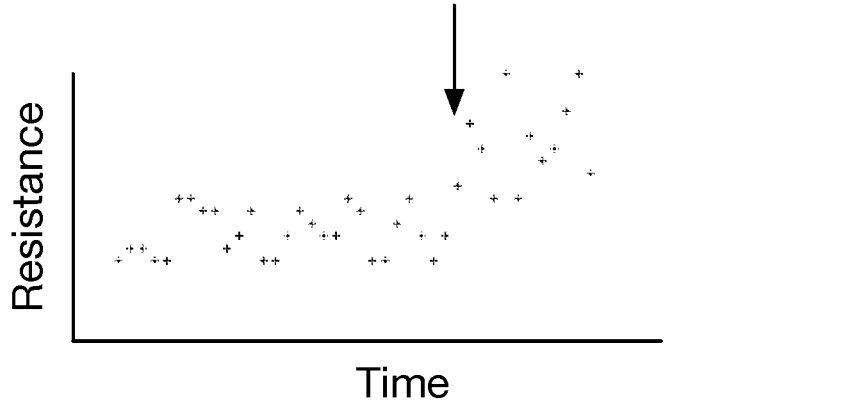
FIG. 5B is a schematic representation of exemplary battery resistance for a battery with a cell that is disconnected.

As an illustrative example (as shown for instance in FIG. 5A and FIG. 5B), a cell disconnection can be determined based on an ohmic resistance of a battery. During normal operation (e.g., when an expected number of battery cells are connected in a parallel), a first resistance can be measured (e.g., with some variance as the resistance can depend on an age, battery state such as state of charge, measurement noise, environment noise, etc.). When a cell of the battery is disconnected, the resistance of the battery can increase (e.g., a statistically significant change in resistance as identified using a statistical test can be observed). In a related example, when a cell of the battery is shorted, the resistance of the battery can decrease. However, the battery property can otherwise be determined or identified.

Determining the battery condition can include generating a flag (e.g., warning, notification, etc.) indicating a battery condition. For instance, a flag indicating normal battery conditions, cell disconnection, cell shorting, thermal issues, and/or any suitable flag can be generated. Additionally or alternatively, battery-operated system operating instructions can be generated (e.g., retrieved from a look-up table based on the battery condition, generated based on the battery condition, etc.), and/or the battery condition can be used in any manner. In some variants, a flag can be generated after a predetermined number (e.g., 1, 2, 5, 10, 20, 50, 100, etc.) of classifications return the same battery condition.

Optionally operating the battery based on the battery condition S400 can function to provide operation instructions and/or suggestions for the battery-operated system based on the battery conditions (e.g., determining, generating, etc. a corrective action). The battery-operated system can be operated manually (e.g., by a user, operator, remotely, etc.) and/or automatically. The battery-operated system is preferably operated based on the battery condition (e.g., as determined in S300). However, the battery-operated system can be operated in any manner. Operation of the battery-operated system can include modifying a charging and/or discharging rate, modifying a load, modifying a capacity, and/or otherwise changing an operation parameter. As an illustrative example, for a two-cell battery, when one cell of the battery is identified as disconnected, a charging rate can be decreased (e.g., by approximately half when the cells are substantially the same) to ensure that the still connected battery cell is not charge at a rate that is greater than a specified charging rate. However, the battery-operated system can be operated in any manner.

S400 (and/or S300 in some variants) can include generating a flag or alert indicating a potential anomalous operation behavior, reducing a system (e.g., battery system, external system, etc.) capability (such as reducing acceleration, velocity, charge rate, disabling one or more functions, etc.), initiating a maintenance request (e.g., service call), modifying a cooling behavior (e.g., increasing or decreasing a cooling capacity, opening or closing all vent ports such as on an aircraft, etc.), turning off an electrical circuit, disconnecting the battery (e.g., disconnecting the battery from a charger), and/or can include any suitable response and/or operation.

The methods of the preferred embodiment and variations thereof can be embodied and/or implemented at least in part as a machine configured to receive a computer-readable medium storing computer-readable instructions. The instructions can be executed by computer-executable components integrated with a system for battery management. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

We claim:

1. A system for detecting a battery anomaly in a battery comprising:
   at least one of:
      a current sensor configured to measure a current dataset associated with the battery;
      a voltage sensor configured to measure a voltage dataset associated with the battery; or
      a temperature sensor configured to measure a temperature dataset associated with the battery;
   a model operable to predict a local property dataset of the battery using the at least one of the current dataset, the voltage dataset, or the temperature dataset;
   a classifier configured to classify whether the battery is operating in an anomalous condition based on the estimated local properties of the battery, wherein the classifier is operable in:
      a steady state mode wherein the classifier is operable to classify the anomalous condition as a thermal anomaly or an electrical short using a local property dataset derived from steady state readings of the at least one of current, voltage, or temperature; and
      a jump change mode wherein the classifier is operable to classify the anomalous condition as a battery cell disconnection or a loss of thermal connection using a local property dataset jump changes in the at least one of current, voltage, or temperature, wherein the jump changes are at least about 0.1 A/s to classify the battery cell disconnection.

2. The system of claim 1, wherein the local property dataset comprises at least one of a capacity, a resistance, a local temperature, a battery variable that depends on a battery temperature, a current, or a state of charge.

3. The system of claim 2, wherein the modeler is further configured to estimate the local property dataset of the battery based on a battery state determined using a state estimator processing the at least one of the current dataset, voltage dataset, or the temperature dataset.

4. The system of claim 2, wherein:
   the capacity is modelled as a function of the state of charge;
   the resistance is modelled as a function of the state of charge, the local temperature, and a polarization of a battery cell of the battery;
   the local temperature is modelled as a function of the temperature dataset, a historic temperature dataset, an ambient temperature, and a heat flux; and
   wherein the state of charge is modelled as a function of at least one of a history of use of the battery, the current dataset, the voltage dataset, or the temperature dataset.

5. The system of claim 1, wherein the classifier operates in the steady state mode or the jump change mode responsive to an inertial moment unit reading associated with the battery.

6. The system of claim 1, further comprising a second classifier configured to determine whether the battery is operating in the anomalous state, wherein the classifier comprises a statistical test comprising at least one of a z-test, a student's t-test, or an F-test, wherein the second classifier comprises at least one of a Kalman filter or an auto regressive integrated average model.

7. The system of claim 1, wherein the classifier is configured to classify whether the battery is operating in the anomalous condition during operation of the battery.

8. The system of claim 1, wherein the classifier is configured to classify whether the battery is operating in the anomalous condition based on at most 100 estimated local parameters.

9. A method for determining whether a battery is operating in an anomalous condition comprising:
measuring a timeseries of sensor data comprising at least one of current, voltage, or temperature;
estimating a timeseries of a local property of the battery using the timeseries of sensor data comprising:
detecting a series of current jumps in the timeseries of sensor data, wherein each current jump of the series of current jumps exceeds a threshold current jump amplitude, wherein the threshold current jump amplitude is about 0.1 A/s; and
calculating a resistance of the battery at each of the current jumps of the series of current jumps; and
classifying whether the battery is operating in the anomalous condition using a statistical test of the timeseries of the local property of the battery;
wherein the anomalous condition comprises a cell disconnection within the battery.

10. The method of claim 9, wherein the statistical test comprises at least one of a student t-test, a z-test, or an F-test.

11. The method of claim 9, wherein the timeseries of the local property comprises at most about 100 local property values.

12. The method of claim 9, wherein estimating the timeseries of the local property comprises estimating at least one of a battery cell capacity, a battery cell temperature, a battery resistance, a variable that depends on a temperature of the battery, the current, or a state of charge of the battery.

13. The method of claim 9, further comprising estimating a battery state of the battery using a state estimator, wherein estimating the timeseries of the local property of the battery further uses the battery state.

14. The method of claim 12, wherein:
the battery cell capacity is modelled as a function of the state of charge;
the resistance is modelled as a function of the state of charge, the local temperature, and a polarization of a battery cell of the battery;
the battery cell temperature is modelled as a function of the temperature dataset, a historic temperature dataset, an ambient temperature, and a heat flux; and
wherein the state of charge is modelled as a function of at least one of a history of use of the battery, the current dataset, the voltage dataset, or the temperature dataset.

15. The method of claim 9, wherein estimating the timeseries of the local property comprises:
detecting a series of temperature jumps in the timeseries of sensor data, wherein each temperature jump of the series of temperature jumps exceeds a threshold temperature jump amplitude; and
calculating a resistance or a local temperature of the battery or a battery cell thereof at each of the temperature jumps of the series of temperature jumps;
wherein the anomalous condition comprises a thermal disconnection within the battery.

16. The method of claim 9, wherein estimating the timeseries of the local property comprises:
detecting a steady state current draw or the battery is at rest; and
calculating a resistance or a local temperature of the battery or a battery cell thereof;
wherein the anomalous condition comprises a thermal anomaly proximal the battery.

17. The method of claim 9, wherein estimating the timeseries of the local property comprises:
detecting when the battery is at rest; and
calculating a state of charge or a current draw while the battery is at rest;
wherein the anomalous condition comprises a short circuit within the battery.

18. The method of claim 9, further comprising: selecting one or more models from a model library; where each model of the model library is operable to estimate the timeseries of a local property; wherein each model of the model library is associated with either an anomalous condition or a normal condition; wherein a statistical probability is assigned to each model of the model library based on the timeseries of sensor data or the time series of the local property; wherein when the statistical probability of a model associated with a failure mode has the greatest statistical probability, the battery is classified as operating in the anomalous condition.

19. The method of claim 18, further comprising, when the battery is classified as operating in the anomalous condition, determining a corrective action.

* * * * *

UNITED STATES PATENT AND TRADEMARK OFFICE
CERTIFICATE OF CORRECTION

PATENT NO. : 11,971,454 B2
APPLICATION NO. : 18/078814
DATED : April 30, 2024
INVENTOR(S) : Evan Murphy et al.

It is certified that error appears in the above-identified patent and that said Letters Patent is hereby corrected as shown below:

In the Claims

Column 22, Line 38, In Claim 18, after "comprising:", insert --¶--

Column 22, Line 39, In Claim 18, after "library;", insert --¶--

Column 22, Line 39, In Claim 18, delete "where" and insert --wherein-- therefor

Column 22, Line 41, In Claim 18, after "property;", insert --¶--

Column 22, Line 43, In Claim 18, after "condition;", insert --¶--

Column 22, Line 45, In Claim 18, after "property;", insert --¶--

Signed and Sealed this
Fourth Day of June, 2024

Katherine Kelly Vidal
*Director of the United States Patent and Trademark Office*